United States Patent
Gao et al.

(10) Patent No.: US 11,617,263 B2
(45) Date of Patent: Mar. 28, 2023

(54) CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Lin-Jie Gao, Shenzhen (CN); Yong-Chao Wei, Qinhuangdao (CN)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/335,059

(22) Filed: May 31, 2021

(65) Prior Publication Data
US 2022/0338348 A1 Oct. 20, 2022

(30) Foreign Application Priority Data
Apr. 14, 2021 (CN) .......................... 202110402159.6

(51) Int. Cl.
*H05K 1/02* (2006.01)
*H05K 1/09* (2006.01)
(Continued)

(52) U.S. Cl.
CPC ............. *H05K 1/114* (2013.01); *H05K 1/056* (2013.01); *H05K 3/0041* (2013.01);
(Continued)

(58) Field of Classification Search
CPC ... H05K 1/02; H05K 1/09; H05K 1/11; H05K 1/16; H05K 1/18; H05K 1/056; H05K 1/114; H05K 3/06; H05K 3/30; H05K 3/0041; H05K 3/42; H05K 3/46; H05K 3/48; H05K 3/421; H05K 3/3452;
(Continued)

(56) References Cited

U.S. PATENT DOCUMENTS 6,300,231 B1 * 10/2001 Haba ................. H01L 23/49838
438/118
7,727,882 B1 * 6/2010 Wu .................. H01L 23/53238
438/643
(Continued)

FOREIGN PATENT DOCUMENTS

JP 2006-86340 A 3/2006
JP 2009-158905 A 7/2009

*Primary Examiner* — Xiaoliang Chen
(74) *Attorney, Agent, or Firm* — ScienBiziP, P.C.

(57) ABSTRACT

A method for manufacturing a circuit board embeds a portion of an outer circuit layer in an outer dielectric layer which increases contact area between the outer circuit layer and the outer dielectric layer, improving adhesion between the outer circuit layer and the outer dielectric layer, and reducing a thickness of the outer circuit substrate, thereby reducing the overall thickness of the finished circuit board.

4 Claims, 10 Drawing Sheets

(51) Int. Cl.
  *H05K 1/11*      (2006.01)
  *H05K 1/16*      (2006.01)
  *H05K 1/18*      (2006.01)
  *H05K 3/06*      (2006.01)
  *H05K 3/30*      (2006.01)
  *H05K 3/42*      (2006.01)
  *H05K 3/46*      (2006.01)
  *H01L 21/768*    (2006.01)
  *H01L 23/48*     (2006.01)
  *H01L 23/498*    (2006.01)
  *G02B 6/10*      (2006.01)
  *H05K 3/00*      (2006.01)
  *H05K 1/05*      (2006.01)
  *H05K 3/34*      (2006.01)

(52) U.S. Cl.
  CPC ........... *H05K 3/3452* (2013.01); *H05K 3/421* (2013.01); *H05K 2201/0191* (2013.01); *H05K 2201/0195* (2013.01); *H05K 2201/0358* (2013.01); *H05K 2201/09036* (2013.01); *H05K 2201/09509* (2013.01); *H05K 2203/0415* (2013.01)

(58) Field of Classification Search
  CPC .... H05K 2201/0191; H05K 2201/0195; H01L 21/768; H01L 21/4763; H01L 23/48; H01L 23/498; G02B 6/10
  USPC ......... 174/250, 251, 260; 361/764; 257/250, 257/251, 260, 737, 751, 773; 385/129, 385/132; 29/832, 846, 852
  See application file for complete search history.

(56) References Cited

U.S. PATENT DOCUMENTS

| | | | |
|---|---|---|---|
| 10,349,518 B1* | 7/2019 | Huang | H05K 1/05 |
| 11,044,813 B2* | 6/2021 | Fu | H05K 3/4611 |
| 2004/0140560 A1* | 7/2004 | Harvey | H01L 23/49816 257/737 |
| 2006/0130303 A1* | 6/2006 | Yamasaki | H05K 1/162 257/E23.079 |
| 2007/0154155 A1* | 7/2007 | Brist | H01P 11/002 385/129 |
| 2007/0154157 A1* | 7/2007 | Horine | H01P 3/121 385/132 |
| 2010/0002406 A1* | 1/2010 | Hsu | H01L 23/49822 361/764 |
| 2010/0101849 A1* | 4/2010 | Sunohara | H05K 1/185 29/832 |
| 2011/0049718 A1* | 3/2011 | Matsumoto | H01L 21/76844 257/E21.584 |
| 2014/0084475 A1* | 3/2014 | Chen | H01L 21/4853 257/773 |
| 2014/0182892 A1* | 7/2014 | Hsu | H05K 1/186 174/251 |

\* cited by examiner

CIRCUIT BOARD AND METHOD FOR MANUFACTURING THE SAME

FIELD

The subject matter herein generally relates to circuit boards, and more particularly, to a circuit board and a method for manufacturing the circuit board.

BACKGROUND

Circuit boards include dielectric layers and circuit layers formed on the dielectric layers. However, such a circuit board may be very thick. Furthermore, a contact area between the circuit layer and the dielectric layer is limited, which reduces adhesion between the circuit layer and the dielectric layer.

BRIEF DESCRIPTION OF THE DRAWINGS

Implementations of the present technology will now be described, by way of example only, with reference to the attached figures.

DETAILED DESCRIPTION

Figure 1:
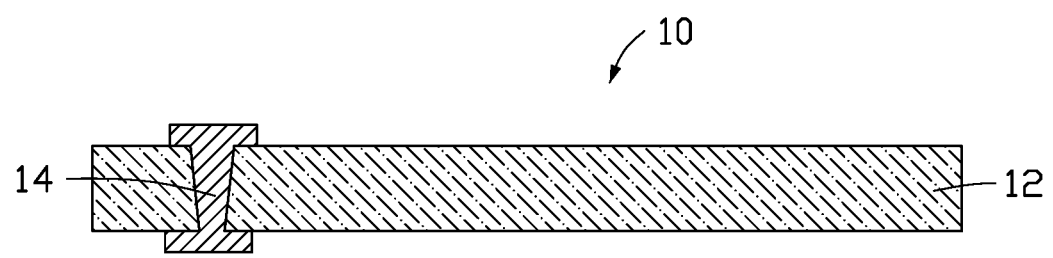
FIG. 1 is a cross-sectional view of an embodiment of an inner circuit substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If there is no conflict, the embodiments and features can be combined with each other.

Figure 9:
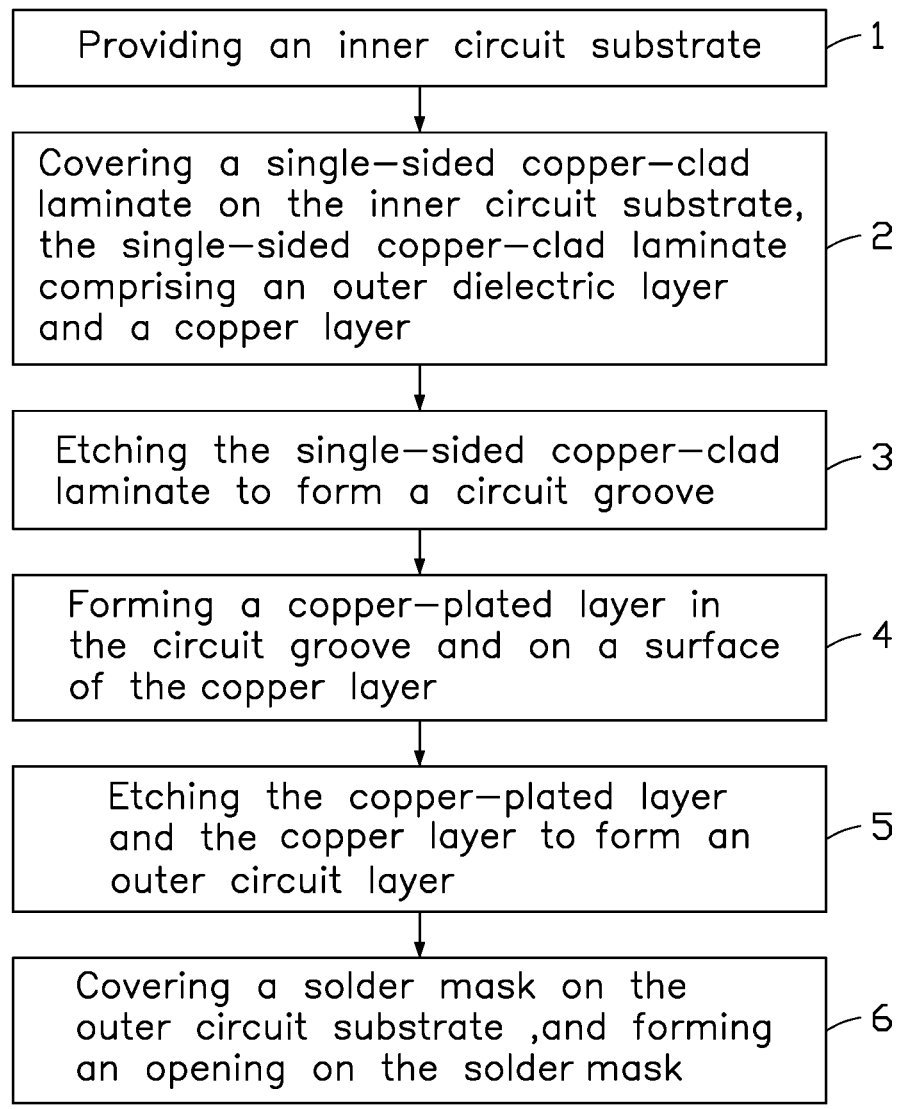
FIG. 9 is a flowchart of an embodiment of a method for manufacturing a circuit board according to the present disclosure.

A method for the manufacturing of a circuit board 100 is provided in accordance with an embodiment. The method is provided by way of example, as there are a variety of ways to carry out the method. Referring to FIG. 9, the method can begin at block 1.

In block 1, referring to FIG. 1, an inner circuit substrate 10 is provided.

The inner circuit substrate 10 can be a flexible circuit board, a rigid circuit board, or a rigid-flexible circuit board.

The inner circuit substrate 10 includes an inner dielectric layer 12 and a number of first conductive pillars 14. Each first conductive pillar 14 penetrates opposite surfaces of the inner dielectric layer 12.

The inner dielectric layer 12 can be made of at least one of polyimide (PI), liquid crystal polymer (LCP), modified polyimide (MPI), polypropylene (PP), and polytetrafluoroethylene (PTFE).

The inner circuit substrate 10 can further include at least one inner circuit layer (not shown) electrically connected to the first conductive pillar 14. That is, the inner circuit substrate 10 can be a single-layer circuit substrate, a double-layer circuit substrate, or a multi-layer circuit substrate.

Figure 2:
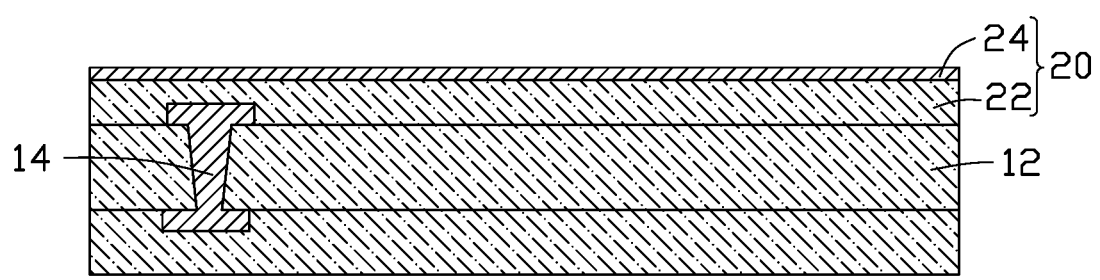
FIG. 2 is a cross-sectional view showing a single-sided copper-clad laminate covering the inner circuit substrate of FIG. 1.

In block 2, referring to FIG. 2, a single-sided copper-clad laminate 20 is formed on the inner circuit substrate 10. The single-sided copper-clad laminate 20 includes an outer dielectric layer 22 and a copper layer 24 stacked in sequence. The copper layer 24 is disposed on a surface of the outer dielectric layer 22 facing away from the inner circuit substrate 10.

The single-sided copper-clad laminate 20 can be formed on one surface of the inner circuit substrate 10. The single-sided copper-clad laminate 20 can also be formed on each surface of the inner layer circuit substrate 10.

Figure 3:
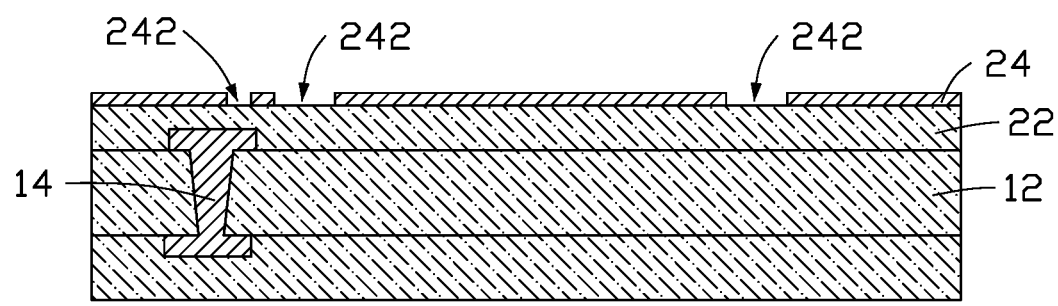
FIG. 3 is a cross-sectional view showing the copper-clad laminate of FIG. 2 etched to form a groove.
Figure 4:
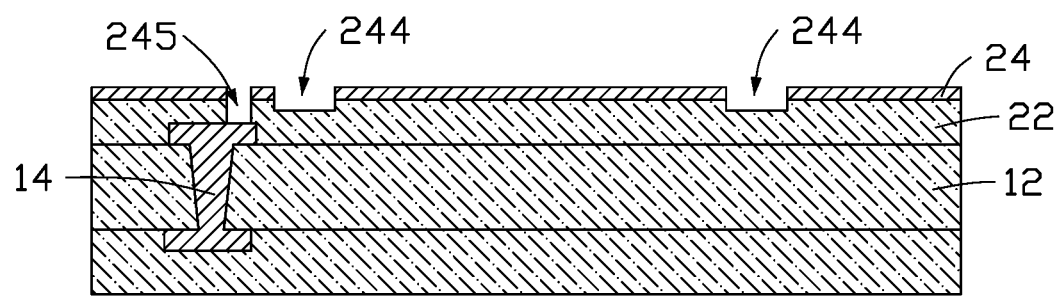
FIG. 4 is a cross-sectional view showing an outer dielectric layer etched from the groove of FIG. 3 to obtain a circuit groove and a blind hole.

In block 3, referring to FIGS. 3 and 4, the single-sided copper-clad laminate 20 is etched to form a circuit groove 244. The circuit groove 244 penetrates the copper layer 24 and a portion of the outer dielectric layer 22.

The outer dielectric layer 22 can be made of at least one of polyimide, liquid crystal polymer, modified polyimide, polypropylene, and polytetrafluoroethylene.

In at least one embodiment, the single-sided copper-clad laminate 20 is etched to form the circuit groove 244. During the etching process, the copper layer 24 is first etched, and then the portion of the outer dielectric layer 22 adjacent to the copper layer 24 is etched to form the circuit groove 244. That is, the circuit groove 244 penetrates the copper layer 24 but does not penetrate the outer dielectric layer 22.

In some embodiments, a blind hole 245 is also formed together with the circuit groove 244, and first conductive pillar 14 is partially exposed from the blind hole 245.

Figure 10:
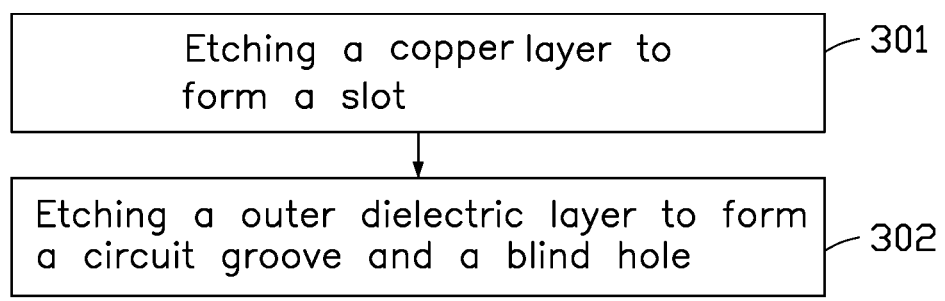
FIG. 10 is a sub-flowchart of blocks in the method of FIG. 9.

In some embodiments, referring to FIG. 10, the formation of the circuit groove 244 and the blind hole 245 may be carried out as follows.

In block 301, referring to FIG. 3, the copper layer 24 is etched to form a slot 242, and the outer dielectric layer 22 is exposed from the slot 242.

In block 302, referring to FIG. 4, the outer dielectric layer 22 exposed from the slot 242 is etched by a plasma etching process to form the circuit groove 244 and the blind hole 245. A depth of etching of the circuit groove 244 and the blind hole 245 can be controlled by the etching time or the power applied in the plasma etching process.

Figure 5:
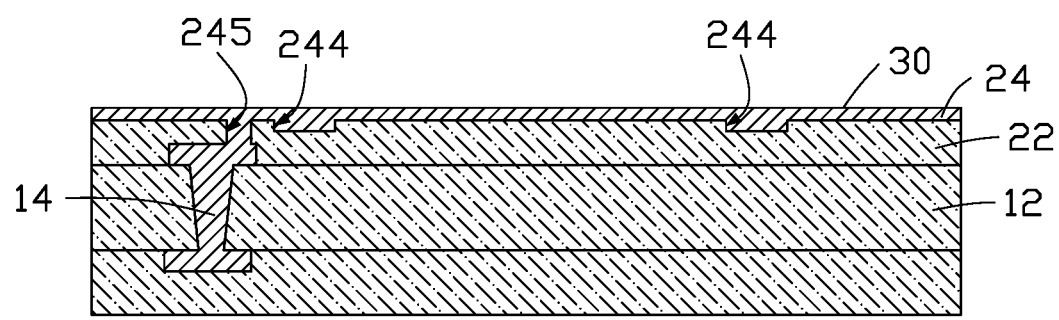
FIG. 5 is a cross-sectional view showing a copper-plated layer formed in the circuit groove and the blind hole and on a copper layer of FIG. 4.

In block 4, referring to FIG. 5, a copper-plated layer 30 is formed in the circuit groove 244 and on a surface of the copper layer 24.

The copper-plated layer 30 may be formed by electroplating.

In some embodiments, the copper-plated layer 30 further infills the blind hole 245 and is connected to the first conductive pillar 14.

Figure 6:
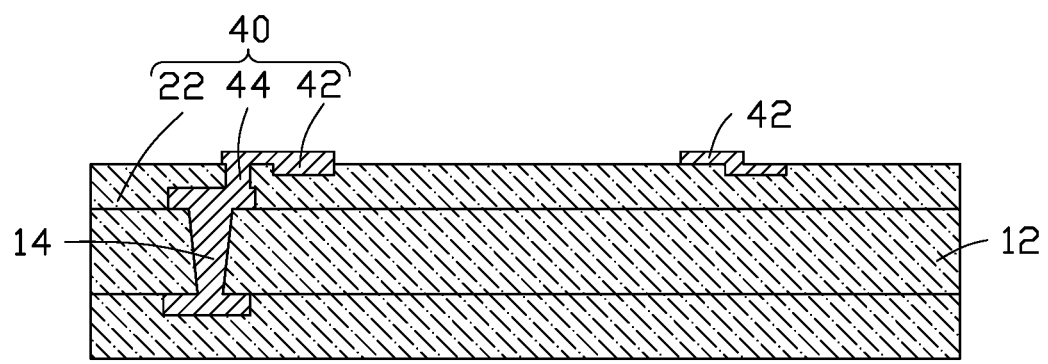
FIG. 6 is a cross-sectional view showing the copper-plated layer and the copper layer of FIG. 5 etched to form an outer circuit layer.

In block 5, referring to FIG. 6, the copper-plated layer 30 and the copper layer 24 are etched to form an outer circuit layer 42, thereby obtaining the circuit board 100.

A portion of the outer circuit layer 42 facing the inner circuit substrate 10 is embedded in the outer dielectric layer 22. A portion of the outer circuit layer 42 away from the inner circuit substrate 10 protrudes from the outer dielectric layer 22. A portion of the outer circuit layer 42 is embedded in the outer dielectric layer 22, which increases the contact area between the outer circuit layer 42 and the outer dielectric layer 22, thereby improving adhesion therebetween. In addition, the outer circuit substrate 40 is reduced in thickness, thereby reducing the overall thickness of the circuit board 100.

In some embodiments, the copper-plated layer 30 in the blind hole 245 forms a second conductive pillar 44. The second conductive pillar 44 is connected to the first conductive pillar 14 and the outer circuit layer 42.

The outer dielectric layer 22, the outer circuit layer 42 and the second conductive pillar 44 cooperatively form an outer circuit substrate 40. The outer circuit substrate 40 is electrically connected to the inner circuit substrate 10.

Figure 7:
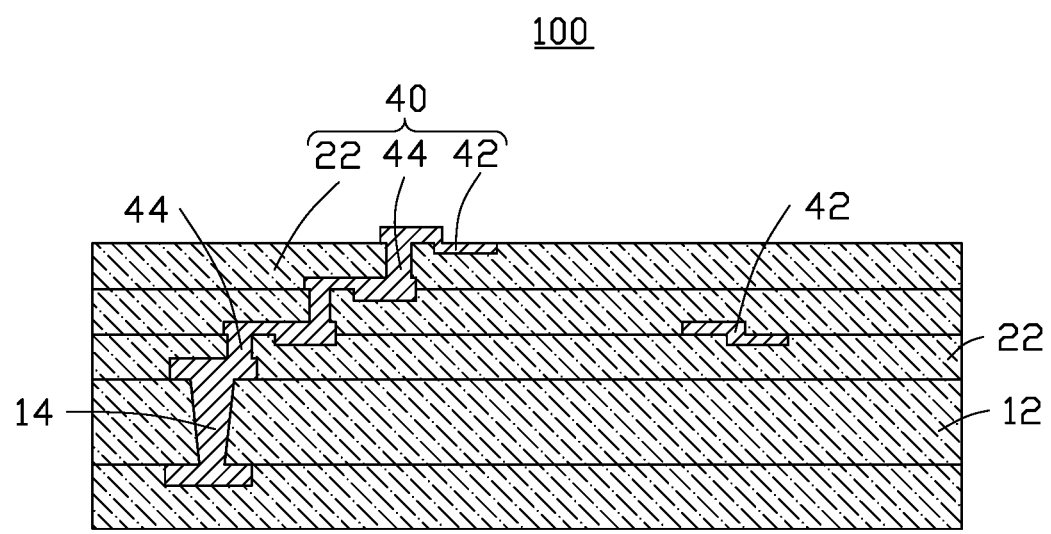
FIG. 7 is a cross-sectional view of a product after processes of FIGS. 2 to 6 are repeated.

In some embodiments, referring to FIG. 7, other circuit layers can be built up and formed. The building-up process can be carried out by repeating the processes of blocks 2 to 5.

In some embodiments, the method for forming the circuit board 100 may further include the following blocks.

Figure 8:
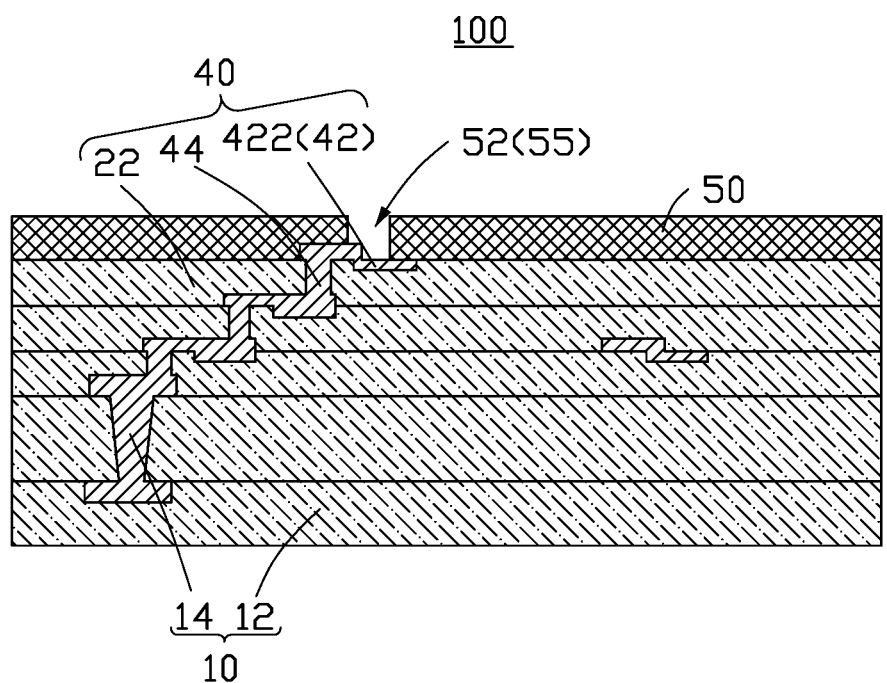
FIG. 8 is a cross-sectional view showing a solder mask with an opening formed on the outer circuit substrate of FIG. 7, thereby obtaining a circuit board.

In block 6, referring to FIG. 8, a solder mask 50 is applied to cover a surface of the outer circuit substrate 40 facing away from the inner circuit substrate 10, and an opening 52 is formed on the solder mask 50, so that a portion of the outer circuit layer 42 is exposed from the opening 52. Then, the circuit board 100 is obtained.

The solder mask 50 covers a surface of the outer dielectric layer 22 away from the inner circuit substrate 10, and the solder mask 50 further covers the outer circuit layer 42. The portion of the outer circuit layer 42 away from the inner circuit substrate 10 is embedded in the solder mask 50. The opening 52 penetrates the solder mask 50. The portion of the outer circuit layer 42 exposed from the opening 52 is a solder pad 422. The soldering pad 422 can allow connections to a conductor (not shown), so as to be electrically connected to other circuit boards (not shown) through the conductor.

In some embodiments, when the outer circuit layer 42 is formed, the copper-plated layer 30 and/or the copper layer 24 are also etched, so that a surface of the portion of the outer circuit layer 42 exposed from the opening 52 has several planes. For example, the surface of the portion of the outer circuit layer 42 can be step-shaped or have grooves at various depths. The portion of the outer circuit layer 42 exposed from the opening 52 forms the solder pad 422, to increase a contact area between the solder pad 422 and the conductor and improve adhesion between the conductor and the solder pad 422. In some embodiments, the opening 52 is combined with the outer circuit substrate 40 to form a groove 55. When the circuit board 100 is electrically connected to another circuit board, liquid solder can be injected into the groove 55. During a soldering process, the groove 55 confines the liquid solder and thus prevents undesired electrical connections between the two circuit boards.

Referring to FIGS. 6 to 8, a circuit board 100 includes an inner layer circuit substrate 10 and an outer circuit substrate 40, and the outer circuit substrate 40 is disposed on the inner layer circuit substrate 10.

The inner circuit substrate 10 can include an inner dielectric layer 12, an inner circuit layer, and a number of first conductive pillars 14. Each first conductive pillar 14 penetrates the inner dielectric layer 12, and the inner circuit layer is disposed on the surface of the inner dielectric layer 12 electrically connected to the first conductive pillar 14.

In some embodiments, the inner circuit substrate 10 can be a single-layer circuit substrate, a double-layer circuit substrate, or a multi-layer circuit substrate. When the inner circuit substrate 10 is a multi-layer circuit substrate, the inner circuit substrate 10 further includes other circuit layers embedded in the inner dielectric layer 12.

The outer circuit substrate 40 can include an outer dielectric layer 22, an outer circuit layer 42, and a second conductive pillar 44, the outer circuit substrate 40 being electrically connected to the inner circuit substrate 10. A portion of the outer circuit layer 42 facing the inner circuit substrate 10 is embedded in the outer dielectric layer 22. A portion of the outer circuit layer 42 away from the inner circuit substrate 10 protrudes from the outer dielectric layer 22. A portion of the outer circuit layer 42 is embedded in the outer dielectric layer 22, which increases the contact area and thus improving adhesion between the outer circuit layer 42 and the outer dielectric layer 22. In addition, part of the outer circuit layer 42 is embedded in the outer dielectric layer 22, improving adhesion between the outer circuit layer 42 and the outer dielectric layer 22. A thickness of the outer circuit substrate 40 is reduced, reducing the overall thickness of the circuit board 100.

The second conductive pillar 44 penetrates the outer dielectric layer 22 and is connected to the first conductive pillar 14 to electrically connect the outer circuit substrate 40 and the inner circuit substrate 10. The second conductive pillar 44 is further electrically connected to the outer circuit layer 42.

Referring to FIG. 8, in some embodiments, the circuit board 100 further includes a solder mask 50. The solder mask 50 is disposed on the outer circuit substrate 40 away from the inner circuit substrate 10. The solder mask 50 covers the outer dielectric layer 22 and the outer circuit layer 42. A portion of the outer circuit layer 42 away from the inner circuit substrate 10 is embedded in the solder mask 50.

The solder mask 50 includes an opening 52. The outer circuit layer 42 includes solder pads 422. The solder pads 422 are exposed from the opening 52. The solder pad 422 allows electrical connections to other circuit boards. In some embodiments, when the circuit board 100 is electrically connected to other circuit boards, liquid solder can be injected into the opening 52 first. During the soldering process, a periphery of the opening 52 prevents the liquid solder from escaping and causing undesired connections between the two circuit boards.

A surface of the solder pad 422 exposed from the opening 52 can have several planes, including but not limited to being step-shaped or having grooves at various depths, which increases a contact area between the solder pad 422 and the conductor for electrical connections, and improves adhesion between the conductor and the solder pad 422. In the embodiment, the surface of the solder pad 422 exposed from the opening 52 is step-shaped.

In some embodiments, the inner circuit substrate 10 and the outer circuit substrate 40 can also be provided with other circuit substrates electrically connected to each other as required.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board, the method comprising:
   providing an inner circuit substrate, the inner circuit substrate comprising an inner dielectric layer and a first conductive pillar penetrating opposite surfaces of the inner dielectric layer;
   covering a single-sided copper-clad laminate on the inner circuit substrate, wherein the single-sided copper-clad laminate comprising an outer dielectric layer and a copper layer, the copper layer disposed on a surface of the outer dielectric layer facing away from the inner circuit substrate;
   etching the single-sided copper-clad laminate to form a circuit groove and a blind hole, the circuit groove penetrating the copper layer and only a portion of the outer dielectric layer, the blind hole penetrating the copper layer and the entire outer dielectric layer above the first dielectric layer, causing the first conductive pillar to expose from the blind hole;
   forming a copper-plated layer in the circuit groove and on a surface of the copper layer, the copper-plated layer further infilling the blind hole to form a second conductive pillar in the blind hole; and
   etching the copper-plated layer and the copper layer to form an outer circuit layer connected to the second conductive pillar, causing a portion of the outer circuit layer facing the inner circuit substrate to be embedded in the outer dielectric layer, thereby obtaining the circuit board.

2. The method of claim 1, further comprising:
   covering a solder mask on a surface of the outer dielectric layer, the solder mask further covering the outer circuit layer; and
   forming an opening on the solder mask, a portion of the outer circuit layer being exposed from the opening.

3. The method of claim 2, further comprising:
   etching a portion of the copper plating layer and/or the copper layer, so that a surface of the outer circuit layer facing away from the inner circuit substrate has several planes and forms a bonding pad; wherein the bonding pad is exposed from the opening.

4. The method of claim 3, wherein forming the circuit groove comprises:
   etching the copper layer by an exposure and development process to form a slot, the outer dielectric layer being exposed from the slot; and
   etching the exposed outer dielectric layer by a plasma etching process to form the circuit groove.

\* \* \* \* \*